Sept. 26, 1961 B. M. BENTON 3,002,144

CONTROLLABLE IMPEDANCES

Filed Aug. 21, 1957 2 Sheets-Sheet 1

INVENTOR.
BRUCE M. BENTON

BY K. W. Thomas

ATTORNEY

Sept. 26, 1961 B. M. BENTON 3,002,144

CONTROLLABLE IMPEDANCES

Filed Aug. 21, 1957 2 Sheets-Sheet 2

INVENTOR.
BRUCE M. BENTON

BY K. W. Thomas

ATTORNEY

United States Patent Office

3,002,144

Patented Sept. 26, 1961

3,002,144

CONTROLLABLE IMPEDANCES

Bruce M. Benton, Bellevue, Wash., assignor to Boeing Airplane Company, Seattle, Wash., a corporation of Delaware

Filed Aug. 21, 1957, Ser. No. 679,425

1 Claim. (Cl. 323—16)

This invention relates to controllable impedances of the transistor type and more particularly to means for increasing the efficiency of such controllable impedances.

Heretofore, transistor type amplifiers, of the class B single frequency type, utilized direct current voltage as the supply voltage and as a result the maximum theoretical efficiency was 78%. The reason for this relatively low efficiency is that the portion of the constant direct current supply voltage not appearing across the load appears across the transistors causing power dissipation, thereby reducing the efficiency of the amplifier.

In high speed aircraft heat dissipation is a major problem. Therefore, components which are incorporated in the high speed aircraft should produce a minimum of heat. One way of solving this problem relative to electrical components such as amplifiers is to replace the amplifier with a high efficiency controllable impedance where applicable.

An object of this invention is to provide for obtaining a maximum of efficiency for a controllable impedance operating at a single frequency of control and supply voltage at any one time.

Another object of this invention is to so utilize a supply voltage of varying magnitude in a transistorized controllable impedance operating in single frequency push-pull operation that there is a minimum of voltage appearing between the emitter electrode and the collector electrode of each of the transistors incorporated in the controllable impedance during the current conduction cycle, to thereby minimize collector power dissipation in each of the transistors.

Other objects of this invention will become apparent from the following description when taken into conjunction with the accompanying drawings in which.

Figures 5, 7:
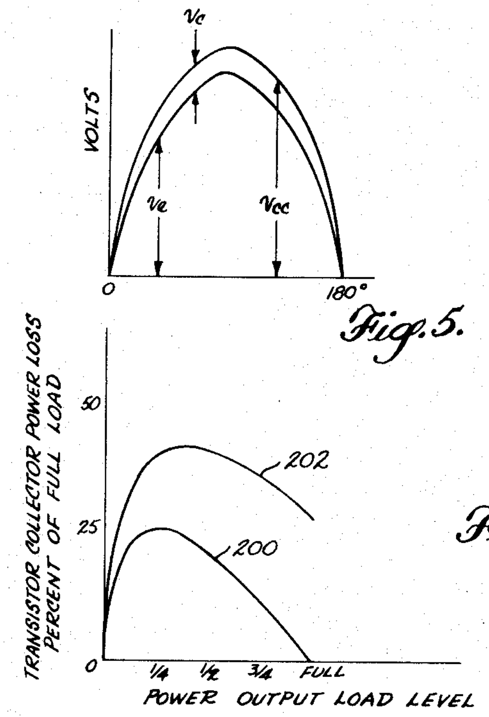
FIG. 5 is a graph illustrating the relationship between the supply voltage, the load voltage, and the voltage appearing between the emitter and collector electrodes of and controllable impedances operating in accordance with the teachings of this invention.
Figure 6:
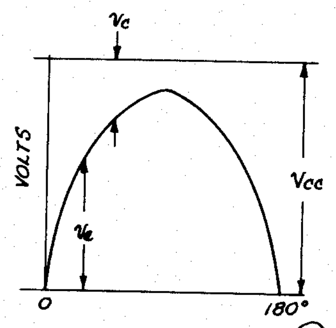

FIG. 6 is a graph showing the same relationships shown in FIG. 5 except as applied to a transistorized amplifier having a constant direct-current supply voltage, and FIG. 7 is a graph illustrating the transistor collector power loss for various power output load levels for a controllable impedance constructed in accordance with the teachings of this invention and for an amplifier constructed in accordance with the teachings of the prior art.

Figure 1:
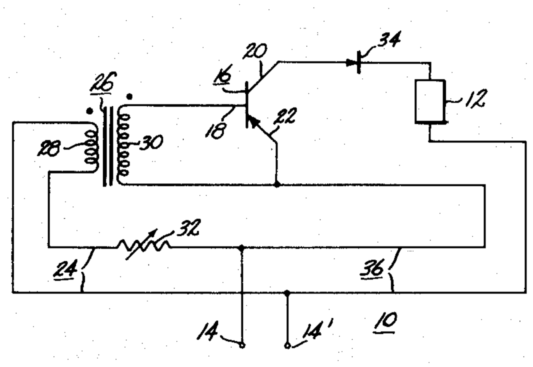
FIG. 1 is a schematic diagram of circuits and apparatus illustrating this invention as applied to a half-wave controllable impedance.

Referring to FIG. 1, there is illustrated a half-wave controllable impedance 10 embodying teachings of this invention. The controllable impedance 10 is connected to be responsive to an alternating control voltage and to an alternating supply voltage of varying magnitude and of substantially the same frequency as the alternating control voltage to effect a varying direct-current voltage across a load 12. In this instance, the alternating control voltage and the alternating supply voltage are both received from input terminals 14 and 14' which have connected there to a suitable source (not shown) of alternating voltage. However, it is to be understood that the alternating control voltage and the alternating supply voltage could be received from separate sources (not shown) provided they are of the same frequency and are properly synchronized. In the latter case the device would be called an amplifier.

In this instance, the controllable impedance 10 includes a p-n-p junction type transistor 16 having a base electrode 18, and two load electrodes, a collector electrode 20 and an emitter electrode 22. Circuit means 24 is provided for applying a measure of the alternating control voltage between the base electrode 18 and the emitter electrode 22, of the transistor 16. As illustrated, the circuit means 24 includes a transformer 26 having a primary winding 28 and a secondary winding 30 which is connected to the base electrode 18 and the emitter electrode 22, of the transistor 16. In practice, the transformer 26 effects a step-down of the voltage appearing across the input terminals 14 and 14' to thus provide the desired control voltage between the base electrode 18 and the emitter eelctrode 22. As can be seen from FIG. 1, the primary winding 28, of the transformer 26, is connected to the input terminals 14 and 14' through a variable resistor 32 which can be adjusted to thus vary the magnitude of the control voltage appearing between the base electrode 18 and the emitter electrode 22.

As illustrated, a unidirectional conducting element or blocking rectifier 34 is connected in series circuit relationship with the load 12 and with the collector electrode 20 and the emitter electrode 22, of the transistor 16. Circuit means 36 is provided for applying the alternating supply voltage appearing between the input terminals 14 and 14' to the latter mentioned series circuit. In operation, the blocking rectifier 34 prevents a voltage from appearing across the load 12 when the polarity of the voltage across the secondary winding 30, of the transformer 26, is such as to render the base electrode 18 positive with respect to its associated emitter electrode 22. In other words, the blocking rectifier 34 prevents the flow of current from the input terminal 14' through the load 12, the collector electrode 20, the base electrode 18, and the secondary winding 30, to the input terminal 14. Such as action would render the collector electrode 20 positive with respect to its associated base electrode 18 thereby turning the transistor 16 "on," to thus conduct current in the reverse direction. This latter undesired action, if the impedance of a secondary winding 30 were relatively low, would damage the transistor 16.

The operation of the controllable impedance 10 will now be described. During the conducting half-cycle when the input terminal 14 is at a positive polarity with respect to the input terminal 14' control current flows from the input terminal 14 through the variable resistor 32 and the primary windings 28, of the transformer 26, to the input terminal 14'. This latter current flow through the primary winding 28 induces a voltage across the secondary winding 30 of such polarity that the emitter electrode 22 is rendered positive with respect to the base electrode 18. This renders the transistor 16 conductive and the load current flows from the input terminal 14 through the emitter electrode 22, the collector electrode 20, of the transistor 16, the blocking rectifier 34, and the load 12, to the input terminal 14'.

During the next half-cycle of operation, when the input terminal 14' is at a positive polarity with respect to the input terminal 14, control current flows from the input terminal 14′ through the primary winding 28, of the transformer 26, and the variable resistor 32, to the input terminal 14. This latter current flow induces a voltage across the secondary winding 30, of transformer 26, of such polarity that the base electrode 18 is rendered positive with respect to the emitter electrode 22, to thereby render the transistor 16 non-conductive. Therefore, owing to the blocking rectifier 34 during this half-cycle of operation no load current flows from the input terminal 14′ through the load 12, the blocking rectifier 34, the collector electrode 20, the base electrode 18, of the transistor 16, and the secondary winding 30, of the transformer 26, to the input terminal 14.

Figure 2:
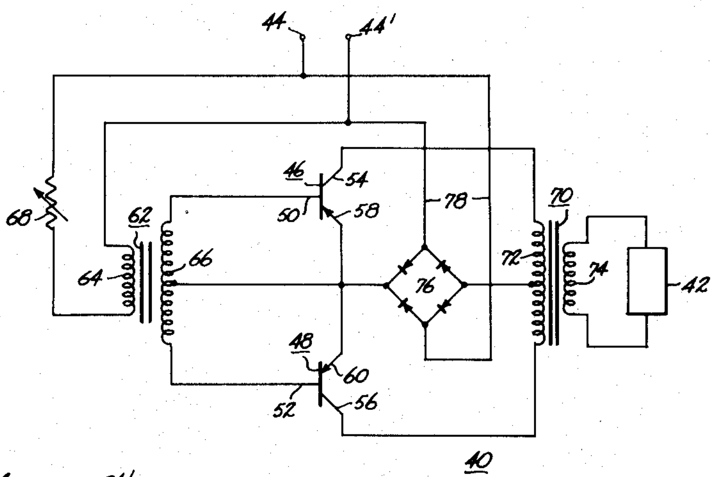
FIG. 2 is a schematic diagram of circuits and apparatus illustrating this invention as applied to one type of full-wave controllable impedance.

Referring to FIG. 2, there is illustrated a full-wave controllable impedance 40 embodying teachings of this invention. In operation, the controllable impedance 40 is responsive to an alternating control voltage and to an alternating supply voltage of varying magnitude and of substantially the same frequency as the alternating control voltage to effect an alternating voltage across a load 42. In this instance, the alternating control voltage and the alternating supply voltage are both received from input terminals 44 and 44′ which have connected thereto a suitable source (not shown) of alternating voltage. However, it is to be understood that the alternating control voltage and the alternating supply voltage could be received from independent sources provided the control voltage and the supply voltage were of substantially the same frequency and were properly synchronized. In the latter case the device would be called an amplifier.

The controllable impedance 40 includes two p-n-p junction type resistors 46 and 48 which comprise base electrodes 50 and 52, respectively, collector electrodes 54 and 56, respectively, and emitting electrodes 58 and 60, respectively. In order to apply the alternating control voltage between the base electrode 50 and the emitter electrode 58, of the transistor 46, and between the base electrode 52 and the emitter electrode 60, of the transistor 48, a transformer 62, having a primary winding 64 and a center-tapped secondary winding 66, is interconnected between the input terminals 44 and 44′ and the transistors 46 and 48. In particular, the primary winding 64, of the transformer 62, is connected to the input terminals 44 and 44′ through a variable resistor 68 which can be adjusted to vary the magnitude of the alternating control voltage applied to the transistors 46 and 48. On the other hand, the upper portion of the center-tapped secondary winding 66, as shown, is connected between the base electrode 50 and the emitter electrode 58, of the transistor 46, while the lower portion of the center-tapped secondary winding 66, as shown, is connected between the base electrode 52 and the emitter electrode 60, of the transistor 48. In operation, the transformer 62 functions as a step-down transformer to provide the desired magnitude of alternating control voltage as applied to the transistors 46 and 48.

For the purpose of providing alternating voltage across the load 42 a transformer 70, having a center-tapped primary winding 72 and a secondary winding 74, is interconnected with the load 42 and with the transistor 46 and 48 and with a full-wave static-type rectifier bridge 76, having an input and an output.

Circuit means 78 is provided for connecting the input terminals 44 and 44′ to the input of the rectifier 76, to thus apply the alternating supply voltage to the input of the rectifier 76. As illustrated, the upper portion of the center-tapped primary winding 72, as shown, is connected in series circuit relationship with the collector electrode 54 and with the emitter electrode 58, of the transistor 46, this latter series circuit being connected to the output of the rectifier 76. In like manner, the lower portion of the center-tapped primary winding 72, as shown, is connected in series circuit relationship with the collector electrode 56 and with the emitter electrode 60, of the transistor 48, this latter series circuit likewise being connected to the output of the rectifier 76.

The operation of the controllable impedance 40 will now be described. Assuming the input terminal 44 is at a positive polarity with respect to the input terminal 44′ then current flows from the terminal 44 through the variable resistor 68 and the primary windings 64, of the transformer 62, to the terminal 44′. Such current flow effects an induced voltage across the center-tapped secondary winding 66 of such polarity that the emitter electrode 58, of the transistor 46, is rendered positive with respect to its associated base electrode 50, to thereby render the transistor 46 conductive. Simultaneously, the polarity of the voltage across the center-tapped secondary winding 66 is such as to render the transistor 48 non-conductive. Also simultaneously, during this same half-cycle of operation load current flows from the terminal 44 through the rectifier 76, the emitter electrode 58, the collector electrode 54, of the transistor 46, the upper portion of the center-tapped primary winding 72, as shown, and the rectifier 76, to the terminal 44′.

During the next half-cycle of operation when the input terminal 44′ is at a positive polarity with respect to the input terminal 44, control current flows from the terminal 44′ through the primary winding 64, of the transformer 62, and the variable resistor 68, to the input terminal 44. This current flow effects an induced voltage across the center-tapped secondary winding 66 of such polarity as to render the emitter electrode 60, of the transistor 48, positive with respect to its associated base electrode 52, to thereby render the transistor 48 conductive. Simultaneously, the polarity of the voltage across the center-tapped secondary winding 66 is such as to render the transistor 46 non-conductive. Also, simultaneously, during this latter half-cycle of operation, load current flows from the input terminal 44′ through the rectifier 76, the emitter electrode 60, the collector electrode 56, of the transistor 48, the lower portion of the center-tapped secondary winding 72, as shown, and the rectifier 76, to the input terminal 44. Thus, the alternate flow of current through the upper and lower portions of the secondary winding 72, as shown, effects an alternating voltage across the secondary winding 74, of the transformer 70, and thus an alternating voltage across the load 42.

Figure 3:
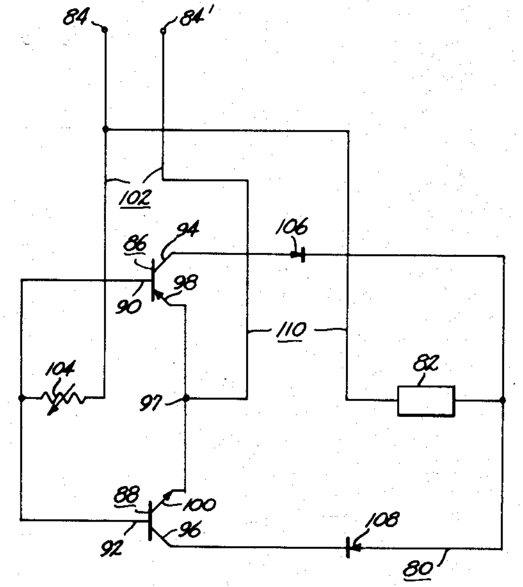
FIG. 3 is a schematic diagram of circuits and apparatus illustrating this invention as applied to another type of full-wave controllable impedance.

Referring to FIG. 3, there is illustrated another full-wave controllable impedance 80 embodying teachings of this invention. The controllable impedance 80 is likewise responsive to an alternating control voltage and to an alternating supply voltage of varying magnitude and of substantially the same frequency as the alternating control voltage to effect an alternating voltage across a load 82. Specifically, the alternating control voltage and the alternating supply voltage are received from input terminals 84 and 84′ which have connected thereto a suitable source (not shown) of alternating voltage.

The controllable impedance 80 includes one p-n-p junction type transistor 86 and one n-p-n junction type transistor 88, the transistors 86 and 88 including base electrodes 90 and 92, respectively, collector electrodes 94 and 96 respectively, and emitter electrode 98 and 100, respectively. In order to apply the alternating control voltage appearing across the input terminals 84 and 84′ to the transistors 86 and 88 circuit means 102 is provided. In particular, the input terminal 84′ is connected to the junction point 97 of the emitter electrodes 98 and 100 and the input terminal 84 is connected to the base electrodes 90 and 92 through a variable resistor 104 which can be adjusted to provide the desired magnitude of control voltage between the base electrode 90 and the emitter electrode 98, of the transistor 86, and between the base electrode 92 and the emitter electrode 100, of the transistor 88.

In order to prevent the transistor 86 from being rendered conductive when the input terminal 84 is at a positive polarity with respect to the input terminal 84′, a blocking rectifier 106 is provided. In other words, if the blocking rectifier 106 were not provided and the input terminal 84 was at a positive polarity with respect to the input terminal 84′ current would flow from the input terminal 84 through the load 82, the collector electrode 94, and the base electrode 90, of the transistor 86, the base electrode 92, and the emitter electrode 100, of the transistor 88, to the input terminal 84′. This latter action would render the transistor 86 conductive when actually the voltage across the input terminals 84 and 84′ is calling for an "off" condition of the transistor 86. On the other hand, in order to prevent the transistor 88 from being rendered conductive when the input terminal 84′ is at a positive polarity with respect to the input terminal 84, a blocking rectifier 108 is provided. If the blocking rectifier 108 were not provided and the input terminal 84′ was at a positive polarity with respect to the input terminal 84 current would flow from the input terminal 84′ through the emitter electrode 98, the base electrode 90, of the transistor 86, the base electrode 92, the collector electrode 96, of the transistor 88, and the load 82, to the input terminal 84. This current flow would render the transistor 88 conductive even through the control voltage appearing across the input terminals 84 and 84′ would be calling for an "off" condition of the transistor 88.

As illustrated, the blocking rectifier 106 and the collector electrode 94, and the emitter electrode 98, of the transistor 86, comprise one branch of a parallel circuit while the blocking rectifier 108 and the collector electrode 96, and the emitter electrode 100, of the transistor 88, comprise the other branch of the parallel circuit. In other words, the parallel circuit includes two branches each of which corresponds to the half-wave type of circuit of FIG. 1 which operates to be conductive on alternate half-cycles of an alternating wave. Circuit means 110, including the load 82, is provided for applying the alternating supply voltage appearing across the input terminals 84 and 84′ to this latter mentioned parallel circuit.

The operation of the controllable impedance 80 will now be described. Assuming the input terminal 84 is at a positive polarity with respect to the input terminal 84′ control current flows from the input terminal 84 through the variable resistor 104, the base electrode 92, and the emitter electrode 100, of the transistor 88, to the input terminal 84′, to thereby render the transistor 88 conductive. Simultaneously, during this same half-cycle of operation, load current flows from the input terminal 84 through the load 82, the blocking rectifier 108, the collector electrode 96, the emitter electrode 100, of the transistor 88, to the input terminal 84′.

During the next half-cycle of operation, when the input terminal 84′ is at a positive polarity with respect to the input terminal 84, control current flows from the input terminal 84′ through the emitter electrode 98, the base electrode 90, of the transistor 86, and the variable resistor 104, to the input terminal 84, to thereby render the transistor 86 conductive. During this same half-cycle of operation load current flows from the input terminal 84′ through the emitter electrode 98, the collector electrode 94, of the transistor 86, the blocking rectifier 106, and the load 82, to the input terminal 84.

Figure 4:
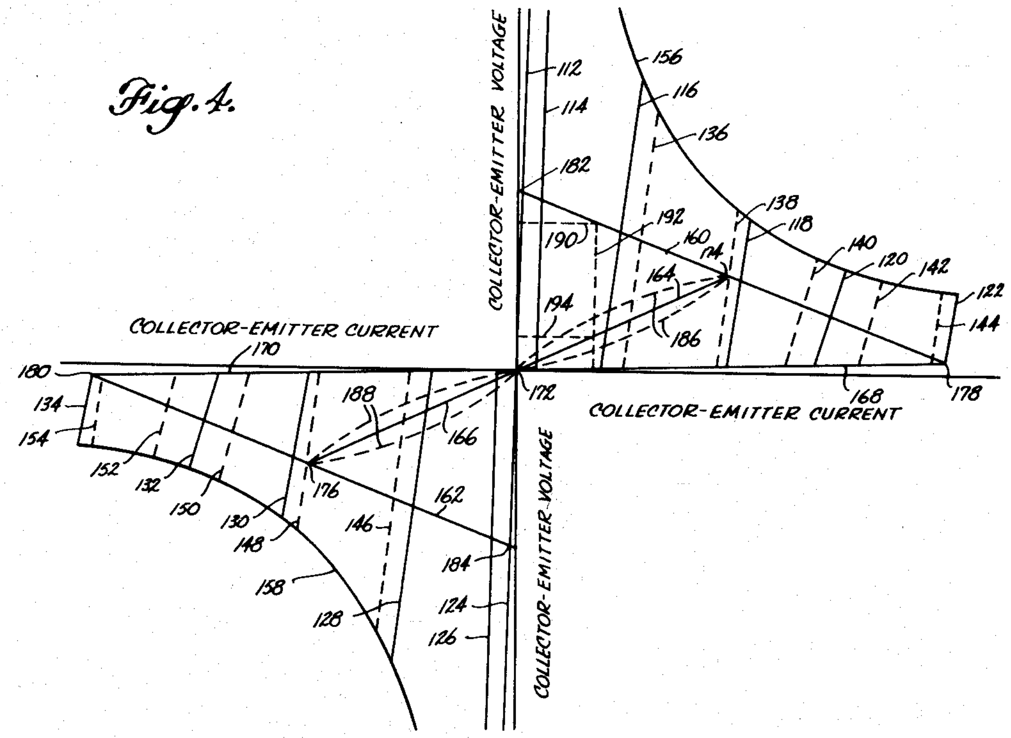
FIG. 4 is a graph illustrating various characteristic curves for the controllable impedances shown in FIGS. 1 through 3.

FIG. 4 is a graph illustrating the typical common emitter characteristic curves of the transistors of FIGS. 1 through 3. For instance, referring to FIGS. 2 and 4, curves 112, 114, 116, 118, 120 and 122 represent the base current drive to the transistor 46 and curves 124, 126, 128, 130, 132 and 134 represent the base current drive to the transistor 48. On the other hand, curves 112, 136, 138, 140, 142 and 144 represent the base-emitter drive voltage to the transistor 46 while curves 124, 146, 148, 150, 152 and 154 represent the base-emitter drive voltage to the transistor 48. The maximum power dissipation limit for the transistor 46 is represented by a curve 156 and the maximum power dissipation limit for the transistor 48 is represented by a curve 158.

A curve 160 is the typical D.-C. load line for an amplifier (not shown) operating for one half-cycle in class B operation. On the other hand, a curve 162 is the typical D.-C. load line for the same amplifier (not shown) operating in the other half-cycle of class B operation.

First we will assume that the variable resistor 68 has been adjusted so that the base control drive to the transistors 46 and 48 is such as to operate the transistors 46 and 48 at half load power in their respective load circuits. Since the portion of the supply voltage appearing between the emitter electrode 58 and the collector electrode 54, of the transistor 46, and between the emitter electrode 60 and the collector electrode 56, of the transistor 48, is of varying magnitude the operation of the transistors 46 and 48, as represented by the common emitter characteristic curves of FIG. 4, is a series of load lines having the same slope as the load lines 160 and 162, the series of load lines for half load operation assuming a pure resistive load being represented by a line 164—166 which is the locus of load lines. One cycle of operation of the controllable impedance 40 at half load operation is from the point 172 to the point 174 and back to the point 172 and from thence to the point 176 and back to the point 172. For full load operation line 168—170 is the locus of load lines. One cycle of operation of the controllable impedance 40 at full load operation is from the point 172 to the point 178 and back to the point 172 and from thence to the point 180 and finally back to the point 172. The locus of load lines for zero load operation is represented by the line 112—124. One cycle of operation of the controllable impedance 40 at zero load operation is from the point 172 to the point 182 and back to the point 172 and from thence to the point 184 and finally back to the point 172.

As hereinbefore mentioned the line 164—166 is the locus of load lines when the load 42 is of a purse resistive type. However, if the load 42 has some inductance the locus of load lines for the transistor 46 will be an elliptical envelope as represented by 186. Still assuming that the load 42 has some inductance the locus of load lines for the transistor 48 is represented by an elliptical envelope 188.

Assuming the supply voltage is a constant direct-current voltage as taught by the prior art and assuming one is operating at half load operation then the instantaneous power dissipation in the transistors (not shown) would be determined from the load line 160 with the aid of for instance line 190 and 192. However, the same instantaneous power dissipation in the transistor 46, in accordance with the teachings of this invention, is determined from the line 164, assuming a resistive load, with the aid of lines 194 and 192. Therefore, the transistors 46 and 48 operate at a much lower power dissipation level than if they were operating class B as taught by the prior art. Although FIG. 4 has been explained with reference to the controllable impedance 40 of FIG. 2 it is to be understood that FIG. 4 also applies to the controllable impedance 10 of FIG. 1 and the controllable impedance 80 of FIG. 3.

FIG. 5 is a graph illustrating the voltage relationships between the instantaneous load voltage $v_1$, the instantaneous collector supply voltage $v_{cc}$, and the instantaneous collector-emitter voltage $v_c$ for one half-cycle of operation in accordance with the teachings of this invention. On the other hand, FIG. 6 is a graph illustrating the voltage relationships between the instantaneous load voltage $v_1$, the collector supply voltage $V_{cc}$, and the instantaneous collector-emitter voltage $v_c$ for one half-cycle of operation in accordance with the prior art when the supply voltage is a constant D.-C. value.

Assuming $I_{co}$ linear with $C_{cc}$ and the transistors are a matched pair the collector efficiency of the transistors when operated in accordance with the teachings of this invention can be calculated as follows:

$$\text{Collector efficiency}=\frac{\text{power out}}{\text{power out}+\text{transistor losses}}$$

$$\text{Collector efficiency}=\frac{\frac{I_c(V_{cc}-V_c)}{2}}{\frac{I_c(V_{cc}-V_c)}{2}+\frac{I_cV_c}{2}+\frac{V_{cc}I_{co}}{2}}$$

$$\text{Collector efficiency}=\frac{I_c(V_{cc}-V_c)}{I_c(V_{cc}-V_c)+I_cV_c+V_{cc}I_{co}}$$

$$\text{Collector efficiency}=\frac{I_c(V_{cc}-V_c)}{I_cV_{cc}+V_{cc}I_{co}}$$

$$\text{Collector efficiency}=\frac{V_{cc}-V_c}{V_{cc}\left(1+\frac{I_{co}}{I_c}\right)}$$

Since at maximum drive signal $$V_{cc}\gg V_c\rightarrow 0$$

and $$I_c\gg I_{co}\rightarrow 0$$

thus $$\text{Collector efficiency percent}=\frac{V_{cc}-V_c}{V_{cc}\left(1+\frac{I_{co}}{I_c}\right)}100\rightarrow 100\%$$

where:

$I_c$=peak collector and load current
$I_{co}$=peak collector leakage with base open circuited
$v_c$=instantaneous collector-to-emitter voltage
$v_{cc}$=instantaneous collector supply voltage
$v_1$=instantaneous load voltage
$V_c$=peak collector-to-emitter voltage
$V_{cc}$=peak collector supply voltage
$V_1$=peak load voltage.

These efficiency calculations have been considered with the transistors operating at full load. A curve 200 in FIG. 7 represents the transistor collector powered loss when the transistors are operating at other values of load. On the other hand, a curve 202 represents the transistor-collector power loss for various values of load operation when operating as class B in accordance with the prior art in which a constant D.C. voltage is utilized as the supply voltage.

Since certain changes may be made in the above described apparatus and circuits and different embodiments of the invention may be made without departing from the spirit and scope thereof, it is intended that all matter contained in the above description or shown in the accompanying drawings shall be interpreted as illustrative and not in a limiting sense.

I claim as my invention:

In a full-wave transistor controllable impedance connected in common emitter configuration for connection to a source of alternating voltage to effect an alternating voltage across a load, the combination comprising, a first and a second transistor each of which has a control electrode, a first load electrode and a second load electrode, a first transformer having a primary winding and a secondary winding having two portions, circuit means for connecting one portion of said secondary winding between the control electrode and the first load electrode of said first transistor and for connecting the other portion of said secondary winding between the control electrode and the first load electrode of said second transistor, other circuit means for interconnecting said primary winding with said source to thus render said second transistor conductive and said first transistor non-conductive during one-half cycle of operation and render said first transistor conductive and said second transistor non-conductive during the next half-cycle of operation, a second transformer including a secondary winding and a primary winding having two portions, a full-wave rectifier having an input and output, further circuit means for connecting said input of said full-wave rectifier to said source, still further circuit means for connecting one portion of said primary winding of said second transformer and the first and the second load electrode of said first transistor in series circuit relationship with one another across said output of said full-wave rectifier, still other circuit means for connecting the other portion of said primary winding of said second transformer and the first and the second load electrode of said second transistor in series circuit relationship with one another across said output of said full-wave rectifier, so that during said one-half cycle of operation when said second transistor is conductive and said first transistor is non-conductive current flows from said source through said full-wave rectifier, the first and the second load electrode of said second transistor, said other portion of said primary winding of said second transformer, and said full-wave rectifier back to said source, and so that during said next half-cycle of operation when said first transistor is conductive and said second transistor is non-conductive current flows from said source through said full-wave rectifier, the first and the second load electrode of said first transistor, said one portion of said primary winding of said second transformer, and said full-wave rectifier back to said source, and still further circuit means for connecting said secondary winding of said second transformer to said load.

References Cited in the file of this patent

UNITED STATES PATENTS

| | | |
|---|---|---|
| 2,691,073 | Lowman | Oct. 5, 1954 |
| 2,774,021 | Ehret | Dec. 11, 1956 |
| 2,777,057 | Pankove | Jan. 8, 1957 |
| 2,809,303 | Collins | Oct. 8, 1957 |
| 2,888,622 | Mooers | May 26, 1959 |